US007095280B2

(12) United States Patent
Regier et al.

(10) Patent No.: US 7,095,280 B2

(45) Date of Patent: Aug. 22, 2006

(54) PROGRAMMABLE GAIN INSTRUMENTATION AMPLIFIER HAVING IMPROVED DIELECTRIC ABSORPTION COMPENSATION AND COMMON MODE REJECTION RATIO

(75) Inventors: Christopher G. Regier, Cedar Park, TX (US); Lauren Sjoboen, Austin, TX (US); Antony Wangsanata, Austin, TX (US); Clayton H. Daigle, Pflugerville, TX (US)

(73) Assignee: National Instruments Corporation, Austin, TX (US)

( * ) Notice: Subject to any disclaimer, the term of this patent is extended or adjusted under 35 U.S.C. 154(b) by 44 days.

(21) Appl. No.: 11/019,008

(22) Filed: Dec. 21, 2004

(65) Prior Publication Data

US 2005/0088229 A1 Apr. 28, 2005

Related U.S. Application Data

(60) Provisional application No. 60/601,936, filed on Aug. 16, 2004.

(51) Int. Cl.
*H03F 3/45* (2006.01)

(52) U.S. Cl. ........................................ 330/258; 330/69

(58) Field of Classification Search ................ 330/258, 330/69, 252, 257, 259

See application file for complete search history.

(56) References Cited

U.S. PATENT DOCUMENTS 5,272,627 A 12/1993 Maschhoff et al.
5,764,546 A 6/1998 Bryant et al.
5,773,990 A * 6/1998 Wilstrup et al. ............ 324/765
5,847,667 A 12/1998 Baek
6,067,584 A 5/2000 Hayles et al.
6,096,094 A 8/2000 Kay et al.
6,166,673 A 12/2000 Odom
6,243,738 B1 6/2001 Hayles et al.
6,380,874 B1 4/2002 Knudsen
6,414,496 B1 * 7/2002 McQuilkin ................. 324/606
6,700,807 B1 3/2004 Williams et al.
6,823,283 B1 11/2004 Steger et al.
6,944,397 B1 * 9/2005 Miwa ......................... 396/106
2003/0038842 A1 2/2003 Peck et al.
2003/0040881 A1 2/2003 Steger et al.
2003/0074489 A1 4/2003 Steger et al.
2003/0163298 A1 8/2003 Odom et al.

* cited by examiner

*Primary Examiner*—Henry Choe
(74) *Attorney, Agent, or Firm*—Meyertons Hood Kivlin Kowert & Goetzel, P.C.; Jeffrey C. Hood; Mario J. Lewin

(57) ABSTRACT

A PGIA for use in measurement devices (e.g., data acquisition device) having improved dielectric absorption (DA) compensation and common mode rejection ratio (CMRR). When a step function is applied to an input of the PGIA, a first and a second DA compensation circuit may generate DA compensation signals derived from the step function. The DA compensation signals may combine with an original response of the PGIA to cancel some of the dielectric absorptions effects and improve the overall step response of the PGIA. An input stage of the PGIA may include a CMRR enhancement circuit to increase symmetry at the inputs of the PGIA. The CMRR enhancement circuit may delay an input signal received at a negative input terminal a particular amount such that it is in phase with an input signal received at a positive input terminal of the PGIA, to improve the CMRR.

39 Claims, 5 Drawing Sheets

PGIA
300
MOSFET
341
Gain Multiplexer
325
Gain Resistors
330
CMRR Enhancement Circuit
580
Signal
371
Current Mirror
335
V+
336
302
303
305
304
DA Compensation Circuit
350A
446
449
447
448
587
588
First Current Source
310
Second Current Source
320
V-
Signal
372
Signal
373
To
I-V Converter
360
DA Compensation Circuit
350B
456
457
458

PROGRAMMABLE GAIN INSTRUMENTATION AMPLIFIER HAVING IMPROVED DIELECTRIC ABSORPTION COMPENSATION AND COMMON MODE REJECTION RATIO

PRIORITY CLAIM

This application claims benefit of priority of U.S. provisional application Ser. No. 60/601,936 titled "Data Acquisition Device Having Improved Common Mode Rejection and Dielectric Absorption Compensation", filed Aug. 16, 2004.

BACKGROUND OF THE INVENTION

1. Field of the Invention

This invention relates generally to measurement and data acquisition systems and, more particularly, to programmable gain instrumentation amplifier (PGIA) design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices which receive the field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in a DAQ device or instrumentation device. The analog signals may be received from a sensor, converted to digital data (possibly after being conditioned) by an analog-to-digital converter (ADC), and transmitted to a computer system for storage and/or analysis. When a measurement system generates an output analog signal, the computer system may generate digital signals that are provided to one or more digital-to-analog converters (DACs) in the DAQ device. The DACs convert the digital signal to an analog signal output that is used, e.g., to stimulate a UUT.

Generally, analog signals that are received at a DAQ device are first routed from a particular channel via a multiplexer. The signals may then enter an instrumentation amplifier, typically a programmable gain instrumentation amplifier (PGIA). A distinctive feature of an instrumentation amplifier is that it provides very high input impedance, common mode rejection ratio (CMRR), and some gain. A PGIA typically applies a specified amount of gain to an input signal, which raises the signal to a higher level and ensures proper A/D conversion. The PGIA may also convert differential input signals applied to the DAQ board to a single-ended output so that the ADC can correctly digitize the data.

The functionality described above may be achieved by utilizing several operational amplifiers (op-amps) with the right combination of other components. However, as more components are added to the input stage, the settling time of the overall amplifier may suffer significantly. Each component may introduce additional delays due to parasitics (also called dielectric absorption), and therefore may change the overall time constant and step response of the amplifier. Moreover, device tolerances, mismatches, and any asymmetrical topology in the instrumentation amplifier often result in a much lower CMRR than the ideal case.

SUMMARY OF THE INVENTION

Various embodiments of an instrumentation amplifier for use in a measurement device are disclosed. In one embodiment, the instrumentation amplifier may be configured as a programmable gain instrumentation amplifier (PGIA). The PGIA may be included in any type of measurement device, e.g., a data acquisition (DAQ) device. It is noted that a measurement device may include one or more of the PGIAs. In one embodiment, the PGIA may include dielectric absorption (DA) compensation circuitry to cancel some of the dielectric absorptions effects and improve the step response of the PGIA. Also, the PGIA may include common mode rejection ratio (CMRR) enhancement circuitry to increase symmetry at the inputs of the PGIA and improve the CMRR associated with the PGIA.

In one embodiment, the DA compensation circuitry of the PGIA may include a first and a second DA compensation circuit, which may be configured as RC circuits. When a step function is applied to the inverting input of the PGIA, the first DA compensation circuit may inject a current into the signal path by way of the bias circuit. The current may be a transient step whose magnitude is determined by the amplitude of the input step function and the resistors in the first DA compensation circuit. In this case, the decay rate of the transient step is equal to the RC time constant of first DA compensation circuit. With proper selection of component values, such a decaying step may approximately cancel the DA of stray capacitance to ground at the current-sensing node of the PGIA. Similarly, the second DA compensation circuit may approximately cancel the effects of other DA in the circuit. Step changes to the inputs of the PGIA may induce step changes in signal current within the PGIA. The signal current may be reflected by an op-amp based current mirror from the left branch of the PGIA to the right branch. The second DA compensation circuit, which may be coupled between the output of the current mirror op-amp and a reference of an I-V converter, may add a slow-settling overshoot to the PGIA response. The magnitude of the overshoot may be determined by the size of the step in the signal current, the values of the resistors in the current mirror and the second DA compensation circuit, and the resistance of the I-V converter reference voltage. The decay rate of the overshoot is equal to the time constant of the second DA compensation circuit. The overshoot may be useful to cancel the undershoot typically caused by DA in most places in the signal path. The I-V converter may generate the final output voltage of the PGIA, which may be sent to an ADC.

In one embodiment, an equalization technique may be used to achieve as much symmetry as possible at the inputs of the PGIA by placing a CMRR enhancement circuit (e.g., an RC circuit) at the negative input side of the PGIA. Capacitance to ground at the current-sensing node of the PGIA, notably from the gain multiplexer, may cause signals applied to the inverting input of the PGIA to experience phase lead relative to signals applied at the noninverting input of the PGIA. The addition of a series RC network (e.g., the CMRR enhancement circuit) between the output of the op-amp at the PGIA inverting input and the bias current circuit may cause a compensating phase lag to be applied to signals received at the inverting input of the PGIA. The result is typically better phase matching between signals received at the two PGIA inputs, and hence improved CMRR.

Figure 1:
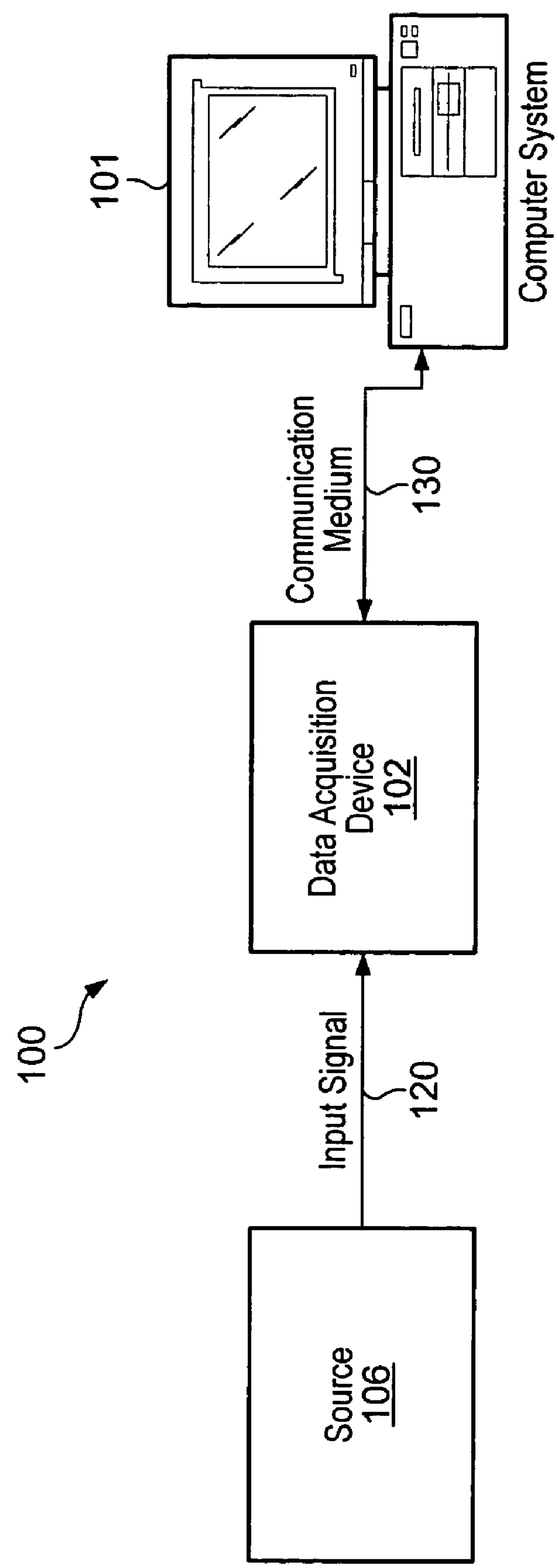
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION

Data Acquisition System

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, MXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive a temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Data Acquisition Device

Figure 2:
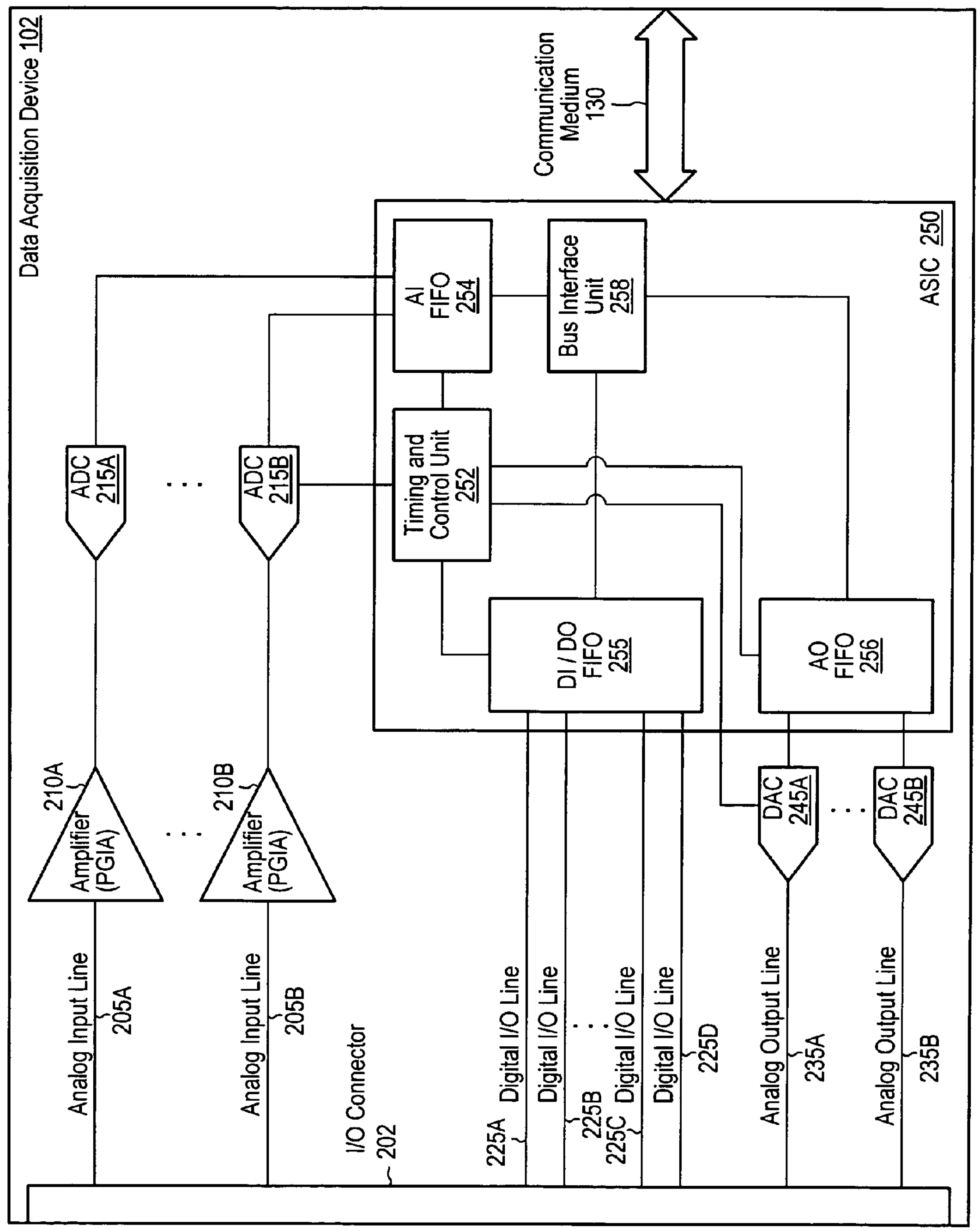
FIG. 2 is a block diagram of one embodiment of a data acquisition (DAQ) device.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., MXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, instrumentation amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to instrumentation amplifiers 210A and 210B. It is noted however that in other embodiments the DAQ device 102 may comprise any number of analog input lines, e.g., three or more analog input lines.

In one embodiment, the instrumentation amplifiers 210A and 210B may be configured as programmable gain instrumentation amplifiers (PGIAs). PGIAs are typically differential amplifiers having a high input impedance and a gain that is adjustable through the digital selection of resistor values. PGIAs may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. In one embodiment, each of the PGIAs 210A and 210B may include dielectric absorption (DA) compensation circuitry to cancel some of the dielectric absorptions effects and improve the step response of the PGIAs, as will be described further with reference to FIG. 3. Also, each the PGIAs 210A and 210B may include common mode rejection ratio (CMRR) enhancement circuitry to improve the CMRR associated with the PGIAs, as will be described further with reference to FIG. 5. It is noted that in other embodiments the data acquisition device 102 may comprise any number of amplifiers, e.g., a single PGIA or four PGIAs.

The output of instrumentation amplifier 210A may be connected to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8=256$). Each discrete value is derived by sampling the analog signal at a predetermined rate (i.e., the sampling rate of the ADC). More specifically, the signal values at particular time intervals are measured and stored. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a mixed-signal ASIC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. It is noted that the DAQ device 102 may comprise any number of DACs, for example, other embodiments may include a single DAC or four DACs. After the digital data is converted to analog form, the analog signals may be sent to the I/O connector 202 via the analog output line 235A.

PGIA with DA Compensation Circuitry

Figure 3:
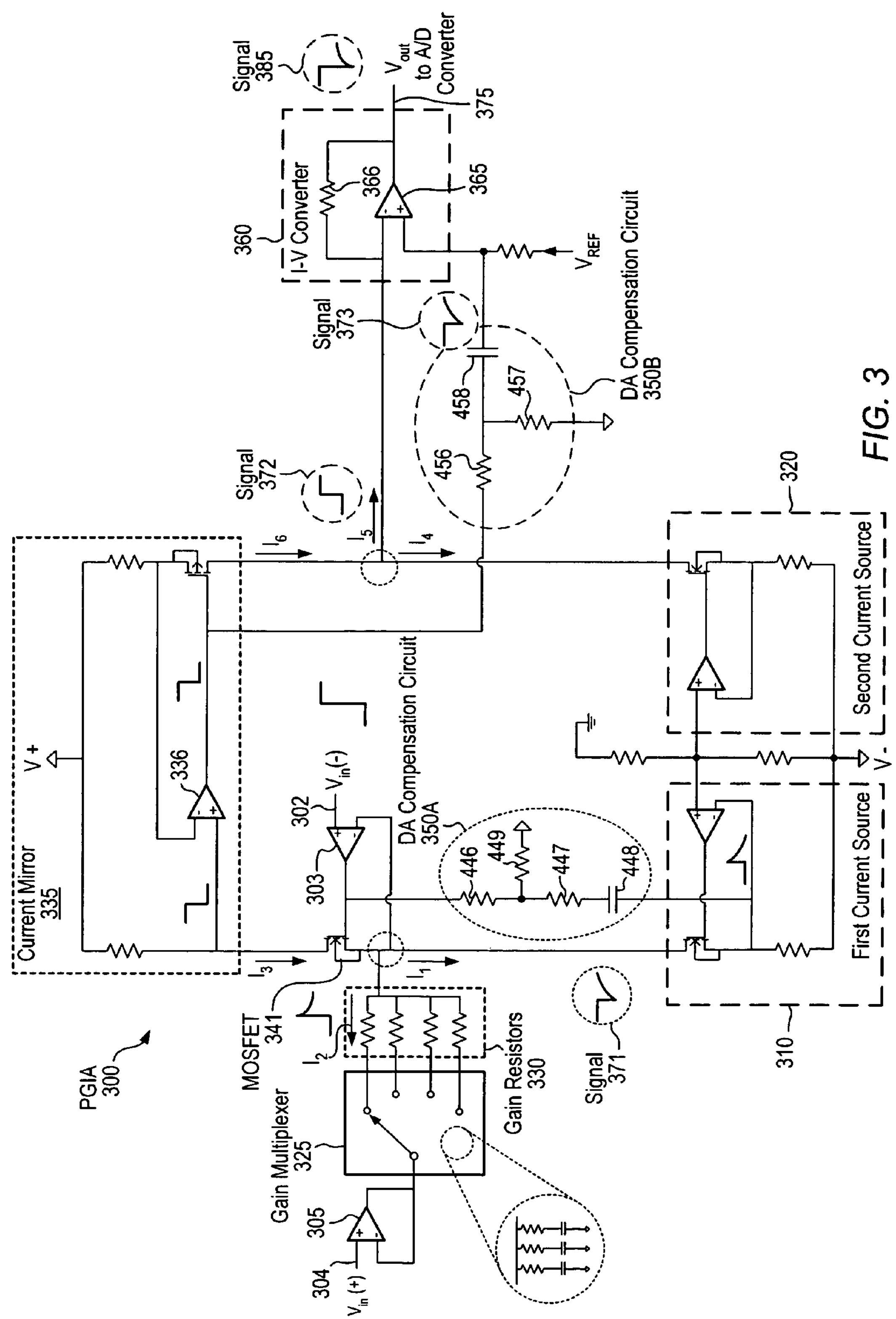
FIG. 3 is a circuit diagram of one embodiment of a programmable gain instrumentation amplifier (PGIA) including dielectric absorption (DA) compensation circuitry.

Turning now to FIG. 3, a circuit diagram of one embodiment of a programmable gain instrumentation amplifier (PGIA) 300 including dielectric absorption (DA) compensation circuits 350A and 350B is shown. The PGIA 300 may be an integrated circuit (IC), for example, an analog IC. The PGIA 300 may be included in a measurement device, e.g., may be the instrumentation amplifier 210A of the data acquisition device 102 of FIG. 2. It is noted however that in other embodiments the PGIA 300 may be included in various types of analog-to-digital systems and measurement devices, such as a computer-based instrument, a data acquisition device or board, a programmable logic device (PLD), an actuator, or other types of devices for acquiring or generating data. The measurement device may be a card or board plugged into one of the I/O slots of a computer system, or a card or board plugged into a chassis, or an external device. The PGIA 300 may comprise the DA compensation circuits 350A and 350B to overcome some of the problems associated with settling time of typical PGIAs due to dielectric absorption, as will be further described below.

In one embodiment, as shown in FIG. 3, the PGIA 300 may comprise a negative input terminal (i.e., $V_{in}(-)$) 302, a positive input terminal (i.e., $V_{in}(+)$) 304, an output terminal (i.e., $V_{out}$) 375, a negative input op-amp 303, a positive input op-amp 305, a first current source 310, a second current source 320, a gain multiplexer 325, gain resistors 330, a current mirror 335, a metal-oxide semiconductor field effect transistor (MOSFET) 341, the DA compensation circuit 350A, the DA compensation circuit 350B, and a current-to-voltage (I-V) converter 360. The negative input op-amp 303 may include a noninverting input terminal, an inverting input terminal, and an output terminal. The noninverting input terminal of the negative input op-amp 303 may be coupled to the negative input terminal 302 of the PGIA 300. Similarly, the positive input op-amp 305 may also include a noninverting input terminal, an inverting input terminal, and an output terminal. The noninverting input terminal of the positive input op-amp 305 may be coupled to the positive input terminal 304 of the PGIA 300. Also, the I-V converter 360 may include a first and a second input terminal and an output terminal. The output terminal of the I-V converter 360 may be coupled to the output terminal 375 of the PGIA 300.

The DA compensation circuit 350A may be an RC circuit, which may include resistors 446, 447, and 449 and a capacitor 448. It is noted that in some embodiment the resistors 447 and 449 are optional. In one embodiment, the resistor 447 may be coupled in series with the capacitor 448, and the resistor 447 may be coupled to the junction of the resistors 446 and 449. The DA compensation circuit 350A may be coupled between the output terminal of the op-amp 303 and the first current source 310.

The DA compensation circuit 350B may also be an RC circuit, which may include resistors 456 and 457 and capacitor 458. It is noted that in some embodiments the DA compensation circuit 350B also includes another resistor in series with the capacitor 448 to increase the time constant. In one embodiment, the capacitor 458 may be coupled between one of the input terminals of the I-V converter 360 and the junction of the resistor 457 and the resistor 456. Furthermore, the I-V converter 360 may include an op-amp 365 and a resistor 366. In one embodiment, the resistor 366 is located in a feedback loop, connected between the inverting input terminal and the output terminal of the op-amp 365.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in some embodiments, the number of resistors and capacitors may vary, e.g., the resistor 456 of the DA compensation circuit 350B may represent the combination of two resistors in series and the capacitor 458 may represent the combination of two capacitors in parallel. In another example, the PGIA 300 may instead be an instrumentation amplifier having a single gain resistor instead of the gain resistors 330.

The input stage of the PGIA 300 may include multiple lines, switches, and multiplexers that may add to the dielectric absorption associated with the input, which may slow down the settling time of the PGIA 300. For example, in a multi-channel DAQ device (e.g., DAQ device 102 of FIG. 2), various channels (e.g., 32 channels) may be connected to multiplexers and other circuitry to scan between channels and send received analog signals to the PGIA 300. In this example, the multiple traces and multiplexers may increase the dielectric absorption of the circuit and therefore may increase the settling time when switching from one channel to another.

Figure 4A:
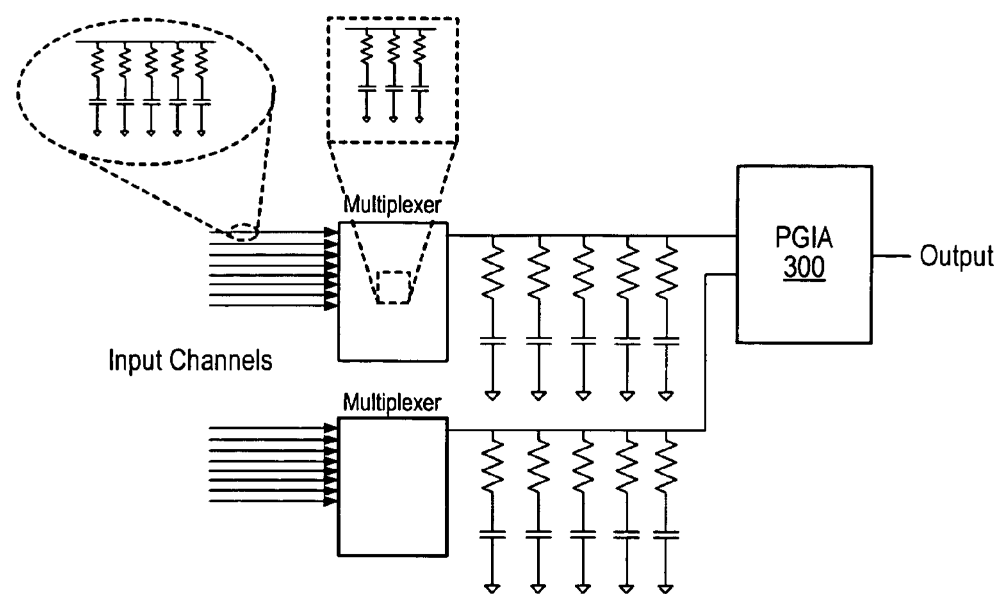
FIG. 4A shows a diagram highlighting typical parasitic capacitors at the input state of the PGIA of FIG. 3.
Figure 4B:
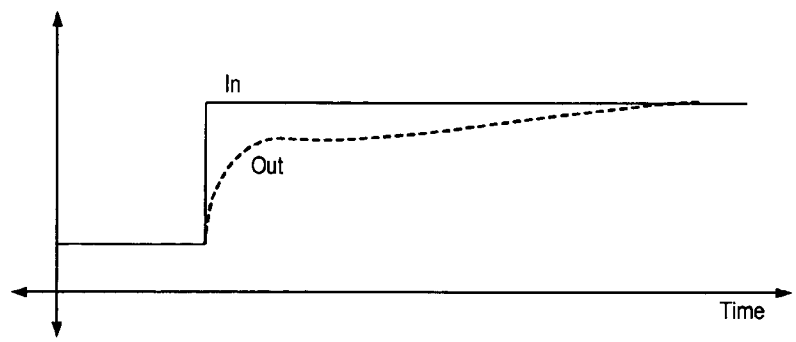
FIG. 4B is a graph showing a slow settling time in typical PGIAs caused by dielectric absorption.

FIG. 4A shows a circuit diagram highlighting typical parasitic capacitors at the input stage of the PGIA 300. Parasitic capacitors may be capacitors that have poor properties, which may cause at least a portion of the dielectric absorption of the circuit. In typical PGIAs, the parasitics from the input multiplexers to the input of the PGIA may have a long time constant due to dielectric absorption, which may cause the settling time to suffer, as illustrated in FIG. 4B. Similar settling time degradation may result from dielectric absorption elsewhere in the circuit as well, such as in the I-V converter 360 or in the ADC coupled to the PGIA. As shown in FIG. 4B, the signal at the output of a typical PGIA having no DA compensation circuitry may take a substantial amount of time to settle, e.g., due to the parasitic capacitors causing dielectric absorption effects with multiple time constants. If a PGIA has a slow settling time, it may affect the speed and performance of the measurement device, e.g., the data acquisition device 102 of FIG. 2.

Settling problems also result from dielectric absorption in the capacitance connected to the current-sensing node of the PGIA, which is the source terminal of MOSFET 341 in the embodiment shown on FIG. 3. The capacitance may include the capacitance of gain multiplexer 325. In the case of DA at this node, the response to a step input signal at $V_{in}(-)$ will exhibit a slow-settling overshoot, rather than an undershoot. This may not affect steps applied to $V_{in}(+)$.

Figure 4C:
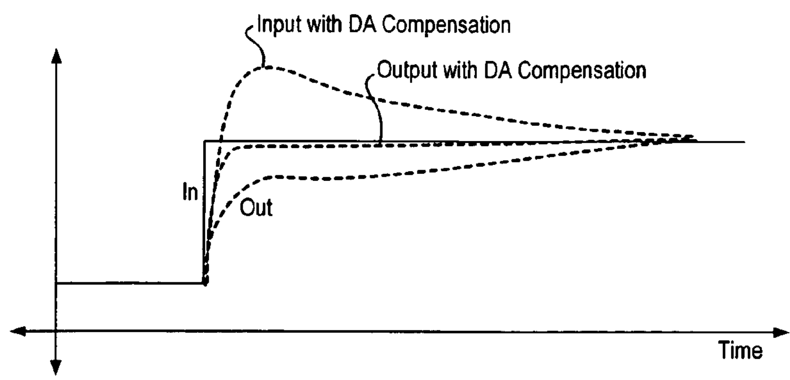
FIG. 4C is a graph showing a faster settling time in the PGIA of FIG. 3 having DA compensation circuitry, according to one embodiment of the invention, compared to the results shown in FIG. 4B.

The PGIA 300 may include the DA compensation circuits 350A and 350B to cancel some of the dielectric absorption effects described above that are found in typical PGIAs. The DA compensation circuits 350A and 350B may equalize the step response of the PGIA 300. To do so, the DA compensation circuits 350A and 350B may generate slow-settling tails to compensate for those caused by undesired dielectric absorption, as will be described further below. FIG. 4C is a diagram illustrating the results when a step signal input is applied before and after equalization. More specifically, FIG. 4C illustrates a faster settling time in the PGIA 300 having DA compensation circuitry (e.g., DA compensation circuits 350A and 350B), according to one embodiment of the invention, compared to the results shown in FIG. 4B.

To determine what kind of compensation is required to equalize the step response of the overall PGIA 300, a test of the step response at the positive input terminal 304 and then at the negative input terminal 302 may be performed. For example, to test the step response at the positive input terminal 304, a constant voltage (e.g., 0V) is placed at the negative input terminal 302 and a step is applied to the positive input terminal 304. Also, to test the step response at the negative input terminal 302, a constant voltage (e.g., 0V) is placed at the positive input terminal 304 and a step is applied to the negative input terminal 302. Then, in this example, the step responses are compared to each other to determine what kind of compensation is required to equalize them. The desired compensation may be achieved by adjusting the RC values of the DA compensation circuit 350A. Then, the equalized responses are compared to a more ideal fast-settling step response to determine how much compensation is required for the rest of the circuit. The desired compensation may be achieved by adjusting the RC values of the DA compensation circuit 350B. In one embodiment, after the RC values are adjusted accordingly, the compensating signals may combine with the original response to obtain an overall step response close to the ideal case, as will be described further below.

The DA compensation circuit 350A may be coupled between the output terminal of the op-amp 303 and the first current source 310. In one embodiment, the first current source 310 may be providing the biasing current to the left branch of the PGIA 300. When an input step function is applied to the inverting input of the PGIA 300, the DA compensation circuit 350A may inject a DA compensation current into the signal path by way of the bias circuit, e.g., the first current source 310. It is noted however that in other embodiments the current may be injected into the signal path by other methods. The DA compensation current may be a small, slowly-decaying current step, e.g., signal 371 shown in FIG. 3. It is noted however that in other embodiments the DA compensation current may be a transient step with other characteristics. The DA compensation signal generated by the DA compensation circuit 350A may be a transient step whose magnitude is determined by the amplitude of the input step function and the resistors therein, e.g., a resistance values resistors 446, 447, and 449. The rate of decay of the current step generated may be dependant upon the RC time constant of the DA compensation circuit 350A. Specifically, in this case, the decay time constant will equal the product of the value of capacitor 448 and the Thevenin equivalent value of resistors 446, 447, and 449.

When the DA compensation signal (e.g., a decaying step) is passed through to the first current source 310, the current $I_1$ may be adjusted momentarily based on the polarity and magnitude of the DA compensation signal, which is dependent upon the polarity and magnitude of the input step function provided at the input of op-amp 303. For example, if the input step function at the input of op-amp 303 is positive (as shown in FIG. 3), the polarity of the DA compensation signal (e.g., signal 371) may be negative, and as a result the current $I_1$ may momentarily decrease by an amount proportional to the magnitude of the DA compensation signal. If the input step function at the input of op-amp 303 is negative, the polarity of the DA compensation signal may be positive, and as a result the current $I_1$ may momentarily increase by an amount proportional to the magnitude of the DA compensation signal. In both cases, the current $I_1$ will typically recover to its initial value with a rate determined by the time constant of the DA compensation circuit 350A. In one embodiment, the adjusted biasing current (due to the DA compensation signal) may combine with an original response of the PGIA to reduce or cancel DA effects and improve the settling time, and therefore improve the overall step response of the PGIA.

The momentary change in current $I_1$ is of opposite polarity to the error in current $I_2$ due to dielectric absorption associated with the gain multiplexer 325, the gain resistors 330, and stray capacitance to ground. With proper selection of component values (e.g., resistors 446, 447, and 449), the DA compensation transient step may approximately cancel or reduce the DA of stray capacitance to ground at the current-sensing node of the PGIA, e.g., the source terminal of MOSFET 341, and therefore improve the step response of the PGIA 300. Thus, the current $I_3$, which carries signal information to the output of the PGIA 300, may contain significantly reduced error due to dielectric absorption than it would without DA compensation circuit 350A.

In addition, when the PGIA 300 receives an input step signal at either of its input terminals 302 or 304, the current mirror 335 typically receives a step change in signal current $I_3$, causing a step change in the voltage at the output of the op-amp 336. The signal current may be reflected by the op-amp based current mirror 335 from the left branch of the PGIA to the right branch. In one embodiment, the DA compensation circuit 350B may be coupled between the output of the op-amp 336 and the reference voltage ($V_{REF}$) input terminal of the I-V converter 360.

The DA compensation circuit 350B may induce a small, slowly-decaying voltage step, e.g., signal 373 shown in FIG. 3, at the reference input to I-V converter 360. It is noted however that in other embodiments the DA compensation voltage step may be a transient step with other characteristics. The magnitude of decaying step 373 that is provided to the I-V converter 360 may be dependant upon the magnitude of the input step signal, the resistor values of the DA compensation circuit 350B, e.g., the resistor values of resistors 456 and 457, the resistor values in the current mirror 335, and the resistance of the reference voltage for the I-V converter 360. The decay rate of the step is determined by the time constant of the RC network comprising the DA compensation circuit 350B and the resistance of the reference voltage for the I-V converter 360. The I-V converter 360 may convert a signal current received at the inverting terminal of the op-amp 365, e.g., signal 372, to an output voltage by multiplying the current by the value of resistor 366 and adding that product to the voltage at its reference input. Since the reference input may contain DA compensating signal 373, the PGIA output 375 may have a slight overshoot (as shown in signal 385 of FIG. 3) due to the transient step, which may compensate for DA in the circuit, whether at the input of the PGIA 300, at its output, or in the corresponding ADC. Therefore, the DA compensation signal may combine with the reference voltage input of the I-V converter 360 to substantially cancel or reduce the DA and improve the step response of the PGIA 300.

In a second embodiment, the DA compensation circuit 350B may be coupled between the output of the op-amp 336 in the current mirror 335 and the source of the MOSFET in current source 310. It should be noted that the configurations described above are meant to be exemplary only, and are not intended to limit the invention to any specific set of configurations. It is noted that in other embodiments the DA compensation circuit 350A and/or 350B may be connected to the PGIA 300 circuitry in various ways to achieve the intended function.

PGIA with CMRR Enhancement Circuitry

Figure 5:
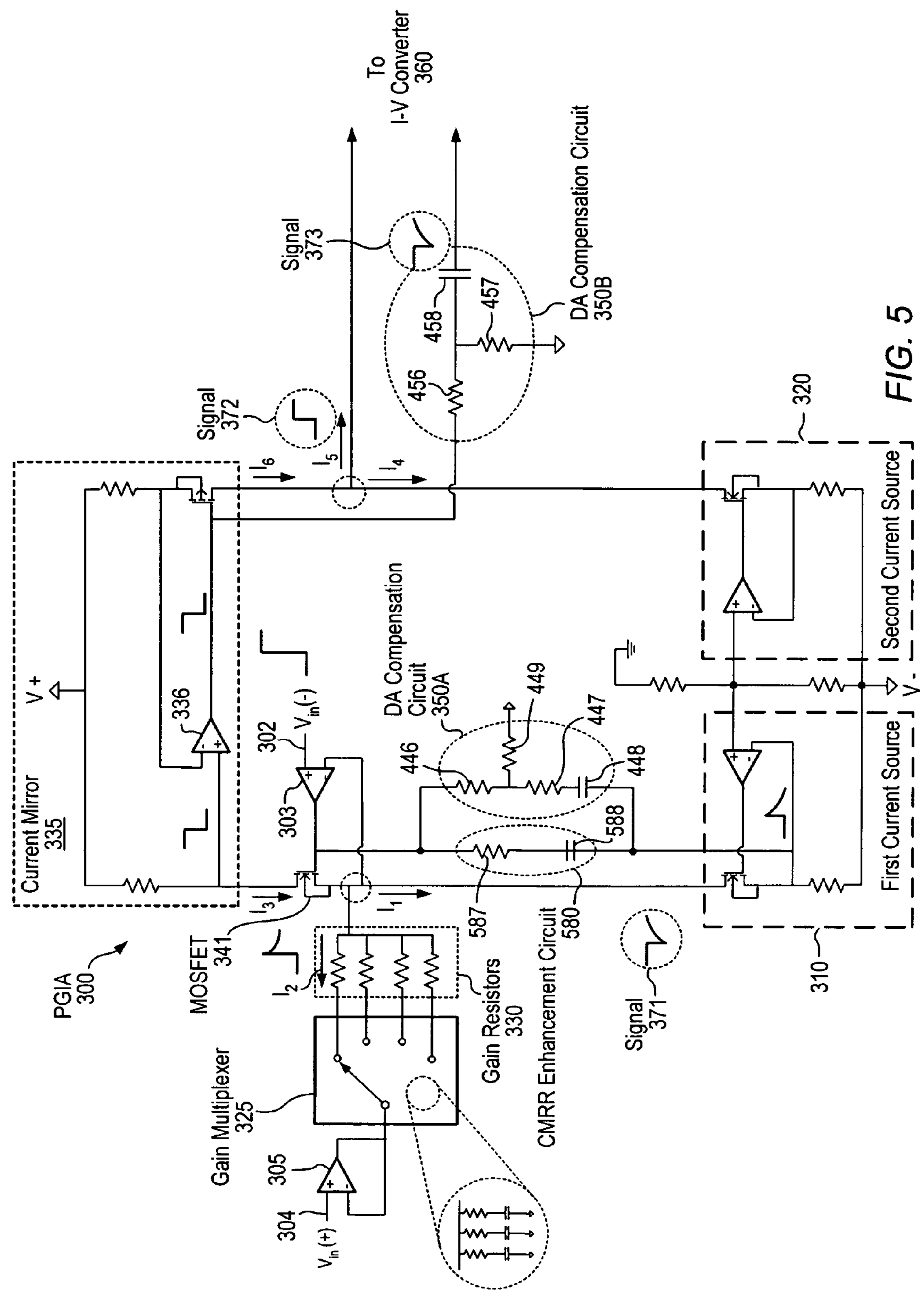
FIG. 5 is a circuit diagram of one embodiment of a portion of the PGIA of FIG. 3 including common mode rejection ratio (CMRR) enhancement circuitry.

FIG. 5 is a circuit diagram of one embodiment of a portion of the PGIA 300 of FIG. 3 including a CMRR enhancement circuit 580. Components that correspond to those shown in FIG. 3 are numbered identically for simplicity and clarity. The PGIA 300 may include the CMRR enhancement circuit 580 to overcome some of the problems associated with low CMRR of typical PGIAs due to asymmetric topology, as will be further described below. It is noted that the PGIA 300 of FIG. 5 may or may not include the DA compensation circuits 350A and 350B, which were described above with reference to FIG. 3.

In one embodiment, the PGIA 300 of FIG. 5 may comprise the components described above with reference to FIG. 3, and in addition, the PGIA may also comprise the CMRR enhancement circuit 580. The CMRR enhancement circuit 580 may be connected in parallel to the DA compensation circuit 350A; therefore, the CMRR enhancement circuit 580 may be coupled between the output terminal of the op-amp 303 and the first current source 310. The CMRR enhancement circuit 580 may be a series RC circuit including a resistor 587 and a capacitor 588.

It should be noted that the components described with reference to FIG. 5 are meant to be exemplary only, and are not intended to limit the invention to any specific set of components or configurations. For example, in various embodiments, one or more of the components described may be omitted, combined, modified, or additional components included, as desired. For instance, in some embodiments, the number of resistors and capacitors may vary, e.g., the resistor 587 of the CMRR enhancement circuit 580 may represent the combination of two resistors in series and the capacitor 588 may represent the combination of two capacitors in parallel. In another example, the PGIA 300 may instead be an instrumentation amplifier having a single gain resistor instead of the gain resistors 330.

The CMRR of the PGIA 300 depends heavily on the symmetry between the positive and negative inputs of the PGIA 300. As shown in FIG. 5, the current-sensing MOSFET 341 may be placed at the negative input side of the PGIA 300, whereas there is typically not a current-sensing MOSFET on the positive input side of PGIA 300. Thus, only the negative input side of PGIA 300 may be sensitive to stray capacitance to ground within the PGIA, notably from gain multiplexer 325, which may add significant phase lead to signals received at the negative input terminal 302 relative to signals received at the positive input terminal 304. Thus, the topology of the PGIA 300 may be asymmetric.

If the topologies at the inputs of the PGIA 300 are asymmetric, the signals (e.g., sinusoids) at the negative and positive input sides of the PGIA 300 may be out of phase. For example, the signal at the positive input side may be lagging the signal at the negative input side. If one of the signals is lagging the other, instead of ignoring the common mode voltage, the PGIA 300 may measure a voltage difference. The voltage difference translates to a voltage drop across the selected gain resistor 330, which will be translated across portions of the PGIA 300 and affect the output of the PGIA 300.

In one embodiment, an equalization technique may be used to achieve as much symmetry as possible at the inputs of the PGIA 300 by placing an RC circuit combination (e.g., the CMRR enhancement circuit 580) at the negative input side of the PGIA 300. If the topology at the inputs of the PGIA 300 is more symmetric, then the CMRR will be greater because the signals at the inputs will be closer to being in phase. In one embodiment, the CMRR enhancement circuit 580 may delay an input signal (e.g., a sinusoid) received at the negative input terminal 302 of the PGIA 300 to improve the CMRR of the PGIA 300. More specifically, the CMRR enhancement circuit 580 may delay an input signal received at the negative input terminal 302 by a particular amount such that the input signal received at the negative input terminal 302 will be in phase with an input signal received at the positive input terminal 304 of the PGIA 300. The particular amount of delay provided by the CMRR enhancement circuit 580 may be dependent upon the RC components therein, e.g., the resistance value of the resistor 587 and the capacitance value of the capacitor 588, as well as the value of the selected gain resistor. In other words, the CMRR enhancement circuit 580 may cause a compensating phase lag to be applied to signals received at the negative input terminal 302 of the PGIA 300. The result is typically better phase matching between signals received at the two PGIA inputs, and hence improved CMRR.

At lower frequencies, the added delay is typically equal to the product of the values of capacitor 588 and the selected gain resistor 330. At higher frequencies, the resistor 587 typically decreases the delay somewhat, allowing more flexibility in canceling the natural phase lead of signals on the negative input terminal 302 of PGIA 300. In other embodiments, the addition of further resistors and capacitors may allow even more control over the added phase lag, providing improved CMRR enhancement over a wider range of frequencies.

It should be noted that the configurations described above are meant to be exemplary only, and are not intended to limit the invention to any specific set of configurations. It is noted that in other embodiments the CMRR enhancement circuit 580 may be connected to the PGIA 300 circuitry in various ways to achieve the intended function.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An instrumentation amplifier for use in a measurement device, the instrumentation amplifier comprising:

a negative input terminal;

an output terminal;

a first op-amp comprising a noninverting input terminal, an inverting input terminal, and an output terminal, wherein one of the input terminals of the first op-amp is coupled to the negative input terminal of the instrumentation amplifier;

a current-to-voltage (I-V) converter comprising a first input terminal, a second input terminal, and an output terminal, wherein the output terminal of the I-V converter is coupled to the output terminal of the instrumentation amplifier;

a first dielectric absorption (DA) compensation circuit coupled to the output terminal of the first op-amp, wherein the first DA compensation circuit is operable to generate a first DA compensation signal which is derived from an input step signal received at the negative input terminal of the instrumentation amplifier; and a second DA compensation circuit coupled to one of the input terminals of the I-V converter, wherein the second DA compensation circuit is operable to generate a second DA compensation signal and provide the second DA compensation signal to the I-V converter;

wherein the first and second DA compensation signals are operable to reduce dielectric absorption and improve a step response of the instrumentation amplifier.

2. The instrumentation amplifier of claim 1, wherein the first DA compensation signal is a decaying current step and wherein a magnitude of the first DA compensation signal is dependent upon an amplitude of the input step signal and resistances of the first DA compensation circuit.

3. The instrumentation amplifier of claim 1, further comprising a first current source operable to provide a biasing current to a signal path of the instrumentation amplifier, wherein the first DA compensation circuit is coupled between the output terminal of the first op-amp and the first current source.

4. The instrumentation amplifier of claim 3, wherein the first DA compensation circuit is operable to inject the first DA compensation signal into the signal path of the instrumentation amplifier via the first current source to adjust the biasing current based on a polarity of the first DA compensation signal.

5. The instrumentation amplifier of claim 4, wherein if the first DA compensation signal is negative the biasing current may decrease momentarily by an amount proportionate to a magnitude of the first DA compensation signal, and if the first DA compensation signal is positive the biasing current may increase momentarily by an amount proportionate to the magnitude of the first DA compensation signal.

6. The instrumentation amplifier of claim 5, wherein an adjusted biasing current is operable to combine with an original response of the instrumentation amplifier to reduce dielectric absorption effects and improve a settling time of the instrumentation amplifier, to improve the step response of the instrumentation amplifier.

7. The instrumentation amplifier of claim 3, wherein the first DA compensation circuit comprises a first resistor, a second resistor, a third resistor, and a first capacitor, wherein the first resistor is coupled to the output terminal of the first op-amp and the first capacitor is coupled to the first current source, and wherein the second resistor is coupled in series with the first capacitor and the second resistor is also coupled to a junction of the first and third resistors.

8. The instrumentation amplifier of claim 1, further comprising a current mirror coupled between a left branch and a right branch of the instrumentation amplifier, wherein the second DA compensation circuit is coupled between one of the input terminals of the I-V converter and an output of the current mirror at the right branch of the instrumentation amplifier.

9. The instrumentation amplifier of claim 8, wherein the second DA compensation signal is a decaying voltage step and wherein a magnitude of the second DA compensation signal is dependent upon an amplitude of the input step signal, resistances of the second DA compensation circuit, resistances of the current mirror, and resistances of the I-V converter.

10. The instrumentation amplifier of claim 1, wherein the second DA compensation signal is operable to combine with a reference voltage signal provided to one of the inputs of the I-V converter to reduce a dielectric absorption and improve the step response of the instrumentation amplifier.

11. The instrumentation amplifier of claim 7, wherein the second DA compensation circuit comprises a fourth resistor, a fifth resistor, and a second capacitor, and wherein the second capacitor is coupled between one of the input terminals of the I-V converter and a junction of the fourth and fifth resistors.

12. The instrumentation amplifier of claim 1, further comprising a common mode rejection ratio (CMRR) enhancement circuit coupled in parallel to the first DA compensation circuit, wherein the CMRR enhancement circuit is operable to delay an input received at the negative input terminal of the instrumentation amplifier to improve a CMRR of the instrumentation amplifier.

13. The instrumentation amplifier of claim 12, further comprising a positive input terminal, wherein the CMRR enhancement circuit is operable to delay the input signal received at the negative input terminal a particular amount such that the input signal received at the negative input terminal will be in phase with an input signal received at the positive input terminal of the instrumentation amplifier, to improve the CMRR of the instrumentation amplifier.

14. The instrumentation amplifier of claim 12, further comprising a first current source, wherein the CMRR enhancement circuit comprises a resistor coupled in series to a capacitor, wherein the resistor is coupled to the output terminal of the first op-amp and the capacitor is coupled to the first current source.

15. The instrumentation amplifier of claim 12, wherein the CMRR enhancement circuit improves a symmetry between a positive input and a negative input of the instrumentation amplifier to improve the CMRR of the instrumentation amplifier.

16. The instrumentation amplifier of claim 1, configured as a programmable gain instrumentation amplifier (PGIA).

17. The instrumentation amplifier of claim 1, comprised in a data acquisition device.

18. An instrumentation amplifier for use in a measurement device, the instrumentation amplifier comprising:

a negative input terminal;

a positive input terminal;

a first op-amp comprising a noninverting input terminal, an inverting input terminal, and an output terminal, wherein one of the input terminals of the first op-amp is coupled to the negative input terminal of the instrumentation amplifier; and a common mode rejection ratio (CMRR) enhancement circuit coupled to the output terminal of the first op-amp, wherein the CMRR enhancement circuit is operable to delay an input signal received at the negative input terminal a particular amount such that the input signal received at the negative input terminal will be in phase with an input signal received at the positive input terminal of the instrumentation amplifier, to improve the CMRR of the instrumentation amplifier.

19. The instrumentation amplifier of claim 18, further comprising a first current source, wherein the CMRR enhancement circuit is coupled between the output terminal of the first op-amp and the first current source, wherein the CMRR enhancement circuit comprises a resistor coupled in series to a capacitor.

20. The instrumentation amplifier of claim 19, further comprising one or more gain resistors coupled to the inverting input terminal of the first op-amp and to the first current source, wherein the particular amount of delay is dependant upon a resistance value of a selected gain resistor and a capacitance value of the capacitor of the CMRR enhancement circuit.

21. The instrumentation amplifier of claim 18, further comprising:

a first dielectric absorption (DA) compensation circuit coupled to the output terminal of the first op-amp, wherein the first DA compensation circuit is operable to generate a first DA compensation signal which is derived from an input step signal received at the negative input terminal of the instrumentation amplifier, wherein the first DA compensation signal generated by the first DA compensation circuit is operable to reduce dielectric absorption and improve a step response of the instrumentation amplifier.

22. The instrumentation amplifier of claim 21, further comprising:

an output terminal;

a current-to-voltage (I-V) converter comprising a first input terminal, a second input terminal, and an output terminal, wherein the output terminal of the I-V converter is coupled to the output terminal of the instrumentation amplifier; and a second DA compensation circuit coupled to one of the input terminals of the I-V converter, wherein the second DA compensation circuit is operable to generate a second DA compensation signal and provide the second DA compensation signal to the I-V converter, wherein the second DA compensation signal generated by the second DA compensation circuit is operable to reduce dielectric absorption and improve the step response of the instrumentation amplifier.

23. A data acquisition device, comprising:

one or more analog-to-digital converters (ADCs) operable to convert received analog data into digital data; and a programmable gain instrumentation amplifier (PGIA) coupled to the one or more ADCs, the PGIA comprising:

a negative input terminal;

an output terminal;

a first op-amp comprising a noninverting input terminal, an inverting input terminal, and an output terminal, wherein one of the input terminals of the first op-amp is coupled to the negative input terminal of the PGIA;

a current-to-voltage (I-V) converter comprising a first input terminal, a second input terminal, and an output terminal, wherein the output terminal of the I-V converter is coupled to the output terminal of the PGIA;

a first dielectric absorption (DA) compensation circuit coupled to the output terminal of the first op-amp, wherein the first DA compensation circuit is operable to generate a first DA compensation signal which is derived from an input step signal received at the negative input terminal of the PGIA;

a second DA compensation circuit coupled to one of the input terminals of the I-V converter, wherein the second DA compensation circuit is operable to generate a second DA compensation signal and provide the second DA compensation signal to the I-V converter, wherein the first and second DA compensation signals are operable to reduce dielectric absorption and improve a step response of the PGIA; and a common mode rejection ratio (CMRR) enhancement circuit coupled in parallel to the first DA compensation circuit, wherein the CMRR enhancement circuit is operable to delay an input received at the negative input terminal of the PGIA to improve a CMRR of the PGIA.

24. The data acquisition device of claim 23, wherein the first DA compensation signal is a decaying current step and wherein a magnitude of the first DA compensation signal is dependent upon an amplitude of the input step signal and resistances of the first DA compensation circuit.

25. The data acquisition device of claim 23, further comprising a first current source operable to provide a biasing current to a signal path of the PGIA, wherein the first DA compensation circuit is coupled between the output terminal of the first op-amp and the first current source.

26. The data acquisition device of claim 25, wherein the first DA compensation circuit is operable to inject the first DA compensation signal into the signal path of the PGIA via the first current source to adjust the biasing current based on a polarity of the first DA compensation signal.

27. The data acquisition device of claim 26, wherein if the first DA compensation signal is negative the biasing current may decrease momentarily by an amount proportionate to a magnitude of the first DA compensation signal, and if the first DA compensation signal is positive the biasing current may increase momentarily by an amount proportionate to the magnitude of the first DA compensation signal.

28. The data acquisition device of claim 25, wherein the first DA compensation circuit comprises a first resistor, a second resistor, a third resistor, and a first capacitor, wherein the first resistor is coupled to the output terminal of the first op-amp and the first capacitor is coupled to the first current source, and wherein the second resistor is coupled in series with the first capacitor and the second resistor is also coupled to a junction of the first and third resistors.

29. The data acquisition device of claim 23, further comprising a current mirror coupled between a left branch and a right branch of the PGIA, wherein the second DA compensation circuit is coupled between one of the input terminals of the I-V converter and an output of the current mirror at the right branch of the PGIA.

30. The data acquisition device of claim 29, wherein the second DA compensation signal is a decaying voltage step and wherein a magnitude of the second DA compensation signal is dependent upon an amplitude of the input step signal, resistances of the second DA compensation circuit, resistances of the current mirror, and resistances of the I-V converter.

31. The data acquisition device of claim 23, wherein the second DA compensation signal is operable to combine with a reference voltage signal provided to one of the inputs of the I-V converter to reduce a dielectric absorption and improve the step response of the PGIA.

32. The data acquisition device of claim 28, wherein the second DA compensation circuit comprises a fourth resistor, a fifth resistor, and a second capacitor, and wherein the second capacitor is coupled between one of the input terminals of the I-V converter and a junction of the fourth and fifth resistors.

33. The data acquisition device of claim 23, further comprising a positive input terminal, wherein the CMRR enhancement circuit is operable to delay the input signal received at the negative input terminal a particular amount such that the input signal received at the negative input terminal will be in phase with an input signal received at the positive input terminal of the PGIA, to improve the CMRR of the PGIA.

34. The data acquisition device of claim 23, wherein the CMRR enhancement circuit comprises a resistor coupled in series to a capacitor, wherein the resistor is coupled to the output terminal of the first op-amp and the capacitor is coupled to a first current source.

35. The data acquisition device of claim 23, wherein the CMRR enhancement circuit improves a symmetry between a positive input and a negative input of the PGIA to improve the CMRR of the PGIA.

36. The data acquisition device of claim 23, comprised in a data acquisition system comprising a computer system for processing data obtained from one or more data acquisition processes.

37. The data acquisition device of claim 36, comprised in a data acquisition system further comprising a unit under test (UUT), wherein the UUT comprises a sensor operable to provide the data acquisition device with sensor data.

38. A PGIA for use in a data acquisition device, the PGIA comprising:

a negative input terminal;

an output terminal;

a first op-amp comprising a noninverting input terminal, an inverting input terminal, and an output terminal, wherein one of the input terminals of the first op-amp is coupled to the negative input terminal of the PGIA;

a current-to-voltage (I-V) converter comprising a first input terminal, a second input terminal, and an output terminal, wherein the output terminal of the I-V converter is coupled to the output terminal of the PGIA;

a first current source operable to provide a biasing current to a signal path of the PGIA;

a first DA compensation circuit coupled between the output terminal of the first op-amp and the first current source, wherein the first DA compensation circuit comprises a first resistor, a second resistor, a third resistor, and a first capacitor, and wherein the second resistor is coupled in series with the first capacitor and the second resistor is also coupled to a junction of the first and third resistors;

a second DA compensation circuit coupled to one of the input terminals of the I-V converter, wherein the second DA compensation circuit comprises a fourth resistor, a fifth resistor, and a second capacitor, and wherein the second capacitor is coupled between the one of the input terminals of the I-V converter and a junction of the fourth and fifth resistors; and a CMRR enhancement circuit coupled in parallel to the first DA compensation circuit, wherein the CMRR enhancement circuit comprises a sixth resistor coupled in series to a third capacitor, wherein the sixth resistor is coupled to the output terminal of the first op-amp and the third capacitor is coupled to the first current source.

39. A data acquisition device, comprising:

one or more analog-to-digital converters (ADCs) operable to convert received analog data into digital data; and a PGIA coupled to the one or more ADCs, the PGIA comprising:

a negative input terminal;

a positive input terminal;

an output terminal;

a first op-amp comprising a noninverting input terminal, an inverting input terminal, and an output terminal, wherein one of the input terminals of the first op-amp is coupled to the negative input terminal of the PGIA;

a current-to-voltage (I-V) converter comprising a first input terminal, a second input terminal, and an output terminal, wherein the output terminal of the I-V converter is coupled to the output terminal of the PGIA;

a first current source operable to provide a biasing current to a signal path of the PGIA;

a first DA compensation circuit coupled between the output terminal of the first op-amp and the first current source, wherein the first DA compensation circuit is operable to generate a first DA compensation signal which is derived from an input step signal received at the negative input terminal of the PGIA;

a second DA compensation circuit coupled to one of the input terminals of the I-V converter, wherein the second DA compensation circuit is operable to generate a second DA compensation signal and provide the second DA compensation signal to the I-V converter, wherein the first and second DA compensation signals are operable to reduce dielectric absorption and improve a step response of the PGIA; and a CMRR enhancement circuit coupled in parallel to the first DA compensation circuit, wherein the CMRR enhancement circuit is operable to delay an input signal received at the negative input terminal a particular amount such that the input signal received at the negative input terminal will be in phase with an input signal received at the positive input terminal of the PGIA, to improve the CMRR of the PGIA.

* * * * *